United States Patent [19]

Murata et al.

[11] Patent Number: 5,014,005
[45] Date of Patent: May 7, 1991

[54] HALL-EFFECT SENSOR WITH COMPONENT POSITIONING ELEMENT FOR DETECTING CRANKSHAFT ANGLE

[75] Inventors: Shigemi Murata; Masayuki Ikeuchi, both of Himeji City, Japan

[73] Assignee: Mitsubishi Denki Kabushiki Kaisha, Tokyo, Japan

[21] Appl. No.: 490,236

[22] Filed: Mar. 8, 1990

[30] Foreign Application Priority Data

Mar. 9, 1989 [JP] Japan ................................. 1-54914
Mar. 15, 1989 [JP] Japan ................................. 1-60705

[51] Int. Cl.$^5$ .......................... G01B 7/30; F02P 7/00; G01P 3/44
[52] U.S. Cl. ......................... 324/207.20; 123/146.5 A; 123/617; 324/174; 310/70 R
[58] Field of Search ............... 324/173, 174, 207.2, 324/207.21, 207.25, 235, 251, 252; 123/414, 617, 146.5 A; 310/70 R, 70 A, DIG. 3; 323/368; 338/32 H; 73/517 R, 518-520

[56] References Cited

U.S. PATENT DOCUMENTS

| | | | |
|---|---|---|---|
| 4,011,476 | 3/1977 | Beard ................................. | 310/70 R |
| 4,165,726 | 8/1979 | Helmer, Jr. ..................... | 310/70 R X |
| 4,235,213 | 11/1980 | Jellissen ...................... | 123/146.5 A |
| 4,359,978 | 11/1982 | Brammer et al. . | |
| 4,635,353 | 1/1987 | Tamagne ................. | 123/146.5 A X |
| 4,771,240 | 9/1988 | Meyer et al. ................. | 324/235 X |

Primary Examiner—Gerard R. Strecker
Attorney, Agent, or Firm—Sughrue, Mion, Zinn, Macpeak and Seas

[57] ABSTRACT

An assembling structure of a Hall-effect sensor device suitable to be used as a crankshaft angle sensor of an automotive internal combustion engine is disclosed. The device comprises: a frame of a resin material which includes a box-shaped accommodating portion opening downward, and a magnetic flux guide holder opposing a side wall of the accommodating portion across a predetermined gap through which a magnetic shutter passes; a Hall IC disposed within the accommodating portion of the frame; a position determining means—such as a resilient member functioning with positioning planar surface portions formed on the interior surfaces of the accommodating portion of the frame, or a holder plate made of a press-formed stainless steel plate having a plurality of engaging projections or claws—for determining the relative position of the Hall IC with respect to the frame; a first magnetic flux guide disposed in the accommodating portion of the frame; a second magnetic flux guide held by the magnetic flux guide holder of the frame; and a permanent magnet adhered to the second magnetic flux guide so as to oppose the Hall IC across the predetermined gap through which the magnetic flux shutter is translated to cause the variation of the magnetic flux that passes through the Hall IC.

12 Claims, 3 Drawing Sheets

HALL-EFFECT SENSOR WITH COMPONENT POSITIONING ELEMENT FOR DETECTING CRANKSHAFT ANGLE

BACKGROUND OF THE INVENTION

This invention relates to Hall-effect sensor devices which can suitably be utilized, for example, for detecting crankshaft angle of an internal combustion engine for controlling the ignition timing.

Various sensor devices, such as position sensors, angle detectors, and velocity sensors, utilizing the Hall effect for converting variations of magnetic flux into an electrical signal are well known. Further, Hall IC's (ingegrated circuits) which incorporate a Hall element in a hybrid integrated circuit mounted on a substrate which is made, for example, of a ceramic material, are also well known. Furthermore, Hall-effect sensor devices including such a Hall IC which is integrated with a magnetic circuit, for the purpose of controlling the ignition timing of an internal combustion engine are also known.

However, the conventional Hall-effect sensor devices have the following disadvantages. Namely, during the molding process of the casing or frame thereof, the constitutive parts of the Hall-effect sensor device, such as the Hall IC or the magnetic circuit parts, must be precisely positioned and fixed within a mold, utilizing a number of jigs for the respective parts. Then, a thermosetting resin is poured into the mold while the parts are thus kept in their respective positions, and then dried and set in a heating furnace. Thus, the process is in need of a multitude of jiqs for fixing the parts at their respective relative positions during the molding, and hence the accuracy of the positioning of the parts is low. As a result this process is not suitable for automated mass production. In addition, the Hall sensor devices produced by this process are low in their signal accuracy.

SUMMARY OF THE INVENTION

A primary object of this invention is, therefore, to provide an integrally molded Hall sensor device which has a high signal accuracy while at the same time can be assembled easily by an automated process.

The above objects are accomplished in accordance with the principle of this invention in a Hall sensor device which comprises: an integrally molded frame of a resin material having a box-shaped accommodating portion opening in one direction, and a magnetic flux guide holder opposing a side wall of the accommodating portion across a predetermined gap; a Hall-effect sensor element, such as a Hall IC, for converting a variation of the variation of the magnetic flux caused by a magnetic shutter into an electrical signal, signal such element being disposed within the accommodating portion of the integrally molded frame; position determining means for determining a relative position of the Hall-effect sensor element with respect to said frame; a first magnetic flux guide made of a magnetic material, disposed in the accommodating portion of the frame in a fixed positional relation with respect to said frame and said Hall-effect sensor element; a second magnetic flux guide held by the magnetic flux guide holder of the frame in a fixed positional relation with respeCt to the frame; and a magnet adhered to said second magnetic flux guide so as to oppose said Hall-effeet sensor element across a predetermined gap through which the magnetic flux shutter is translated to cause the variation of the magnetic flux that passes through the Hall-effect sensor element.

In one preferred aspect of this invention, the above-mentioned position determining means comprises: at least one position determining planar portion on an interior surface of the box-shaped accommodating portion of the frame, a surface of the Hall-effect sensor element abutting on the position determining planar portion; and a resilient member which urges the Hall-effect sensor element, preferably via the first magnetic flux guide, toward the position determining planar portion. Perferrably, the position determining means comprises two position determining planar portions formed on interior surfaces of the accommodating portions of the frame to form a right angle therebetween, the Hall-effect sensor element abutting on the two position determining planar portions at surfaces of a plate-shaped substrate thereof; and the resilient member urges the Hall-effect sensor element in two directions toward the two position determining planar portions.

In another preferred aspect of this invention, the position determining means comprises a holder plate having positioning means for holding and positioning the Hall-effect sensor element, the holder plate being accomodated within the accommodating portion of the frame in a fixed positional relation with respect thereto. It is further preferred that the opening of said accommodating portion of the frame is closed by a filler material filled therein. Further, the holder plate is preferably made of a press-formed stainless steel plate having a plurality of projections or claws consituting the positioning means of the holder plate.

BRIEF DESCRIPTION OF THE DRAWINGS

The novel features which are believed to be characteristic of this invention are set forth with particularity in the appended claims. This invention itself, however, both as to the structure and method of operation, together with further obJects and advantages thereof, may best be understood from the following detailed description of the preferred embodiments, taken in connection with the accompanying drawings, in which:

In the drawings, like reference numerals represent like parts, unless specifically stated otherwise.

DETAILED DESCRIPTION OF THE PREFERRED EMBODIMENTS

Figure 1:
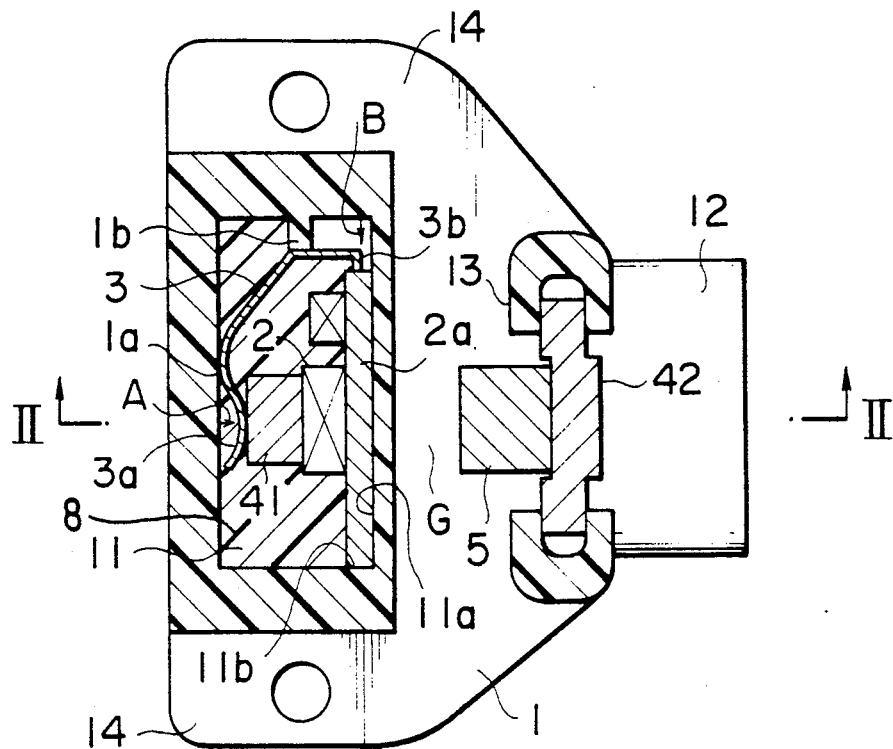
FIG. 1 is a top view of a first embodiment of the Hall-effect sensor device according to this invention, showing a portion thereof in a horizontal cross section along line I—I in FIG. 2.
Figure 2:
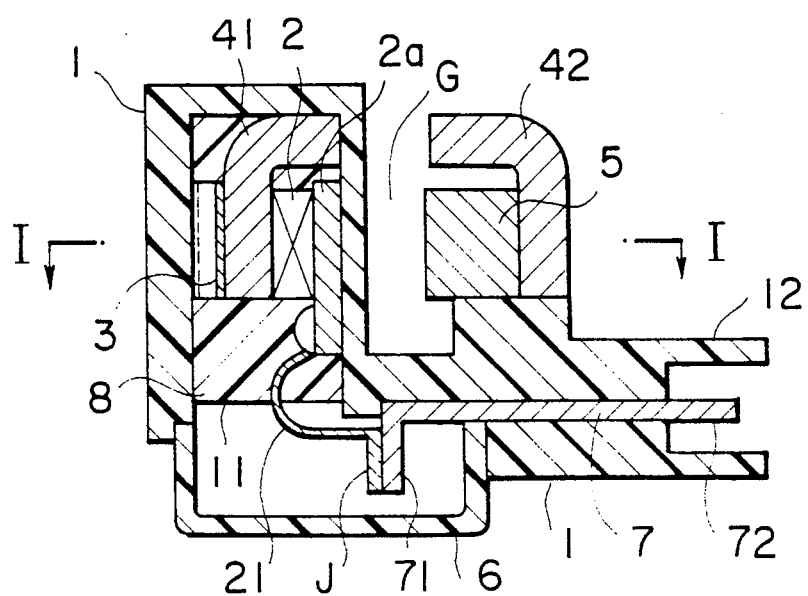
FIG. 2 is a side sectional view of the Hall-effect sensor device of FIG. 1 , showing the vertical section thereof along line II—II in FIG. 1.

Referring now to FIGS. 1 to 4 of the drwainqs, embodiments of this invention are described; referring first to FIGS. 1 and 2, let us describe a first embodiment of this invention, which can suitably be used as a crankshaft angle sensor device for controlling the ignition timing of a contactless type ignition system of an automotive internal combustion engine.

In FIGS. 1 and 2, the Hall-effect sensor device according to this invention comprises a frame 1 made of molded resin material such as a thermoplastic resin (e,g., polybutylene terphthalate (PBT). The frame 1 includes: a rectangular box-shaped accomodating portion or cavity 11 (shown at the left in the figures) extending upward from the base portion of the frame 1 and having planar positioning portions 11a and 11b formed on interior surfaces thereof for determining the position of the Hall IC 2; a connector portion 12 extending toward the right in the figures, for providing electrical connection to the Hall IC 2; a pair of magnetic flux guide holders 13 having opposed U-shaped horizontal cross sections (see FIG. 1) for holding a second magnetic flux guide 42 made of a magnetic material therebetween; and a pair of attachment wing portions 14 (see FIG. 1) extending laterally from both sides of the base of the accommodating box portion 11. The Hall IC 2 accomodated in the accommodating portion 11 of the frame 1 includes, as is well known to those skilled in the art, a Hall element which generates an electrical signal in response to the variation of the magnetic flux passing therethrough; the Hall element of the Hall IC 2 is mounted on a ceramic substrate 2a together with other circuit elements, such as proteCtive elements, to form a hybrid integrated circuit. A resilient member 3 presses the substrate 2a of the Hall IC 2 against the positioning portions 11a and 11b of the accommodating box 11, so as to precisely determine the position of the Hall IC 2. Namely, the resilient member 3, consisting for example of a leaf spring, bears on the portions 1a and 1b on the interior surface of the accommodating box portion 11 of the frame 1; thus an end 3a of the resilient member 3 bearing on a first magnetic flux guide 41 made of a magnetic material urges, by means of the spring action thereof, the Hall IC 2 via the magnetic flux guide 41 in the direction toward the positioning portion 11a (in the direction indicated by an arrow head A in FIG. 1); in addition, the other end 3b of the resilient member 3 urges the substrate 2a of the Hall IC 2 toward the positioning portion 11b (in the direction indicated by the arrow B in FIG. 1). A filler material 8, made for example of silicon gel, closes the opening of the accommodating portion 1 1 of the frame 1, as shown in FIG. 2.

As shown in FIG. 2, the rectangular prism-shaped first magnetic flux guide 41 has an inverted L shaped vertical cross section, whose upper bent end portion extends toward the gap G, to oppose thereacross the upper bent portion of the plate-shaped second magnetic flux guide 42, which is fitted to and supported by a pair of the opposing magnetic flux guide holders 13, the two sides of the second magnetic flux guide 42 being inserted and held between the two legs of the U's of the holders 13, as shown in FIG. 1. The rectangular permanent magnet 5 is adhered to the second magnetic flux guide 42 by an adhesive (not shown), such that the permanent magnet 5 and the Hall IC 2 (or more precisely the side wall of the accomodating box 11 of the frame 1 situated between the permanent magnet 5 and the Hall IC 2) oppose each other across a gap G through which a magnetic shutter (not shown) is translated; the magnetic shutter causes a variation of the magnetic flux passing through the Hall IC 2, as described below. Further, as shown in FIG. 2, the bottom of the frame 1 is closed by a cup-shaped cover 6, made for example of silicon gel; and the ends of inserted conductors 7, extending horizontally through the interior of the frame 1, are exposed within the cover 6 to from downwardly bent connecting portions 71 for the leads 21 of the Hall IC 2; the connecting portions 71 are spot-welded to the leads 21 at the portions J. The other ends of the inserted conductors 7 extend into the recess of the connector portion 12 to from connector pins 72.

In the case where the above Hall-effect sensor device is utilized as a crankshaft angle sensor of an internal combustion engine, the method of operation of the device is as follows. A hollow cylindrical magnetic shutter (not shown) having a plurality of circumferentially spaced teeth is rotated in synchrony with the crankshaft of the engine, such that the teeth thereof pass through the gap G. Thus, the magnetic flux passing through the Hall IC 2 is turned on and off by the rotating magnetic shutter. In response thereto, the Hall IC 2 generates an electrical signal corresponding to the rotation of the internal combustion engine, which electrical signal is supplied to an exterior circuit (not shown) to be processed therein, whereby the crankshaft angle of the engine is detected. This method of operation of the Hall-effect sensor device is well known and hence further description thereof is deemed unnecessary.

The above Hall-effect sensor device is enhanced in signal accuracy and lends itself easily to an automatic assembling process. Namely, the position of the Hall IC 2 is determined by the positioning portions or faces 11a and 11b formed on the interior surface of the accommodating portion 11. Hence, in the assembling step thereof, the relative positions of the parts of the Hall-effect sensor device are determined accurately and automatically by the simple steps of: (a) inserting the Hall IC 2, the first magnetic flux guide 41, and the resilient member 3 within the accommodating portion 11 of the frame; and (b) fitting to the magnetic flux guide holders the second magnetic flux guide 42 to which the permanent magnet 5 is adhered by an adhesive. On the other hand, it is easy to produce the Hall IC 2 itself and the frame 1 with a high precision, keeping the dimensional errors thereof within a predetermined limit. Thus, according to the above embodiment, the positioning accuracy of the parts of the Hall-effect sensor device can easily be enhanced, and hence sensors with enhanced signal generation accuracy can be obtained. In addition, since no jigs are necessary for fixing the relative positions of the parts during the assembling step, the automation of the production steps including the assembling of the device can be easily realized.

Incidentally, in the above embodiment, two planar positioning portions 11a and 11b are formed for determining the relative position of the Hall IC 2 with respect to other magnetic circuit members, wherein the resilient member 3 urges the Hall IC in the two directions A and B indicated in FIG. 1 . However, the number of the positioning portions is not limited to two, and may be equal to one, or more than two; further, the locations of the positioning portions or the urging directions of the Hall IC are not limited to those of the above embodiment. Furthermore, the structure and form of the magnetic flux guides 41 and 42, the position of the permanent magnet 5, or the material of the respective parts, etc., are not limited to those of the above embodiment.

Figure 3:
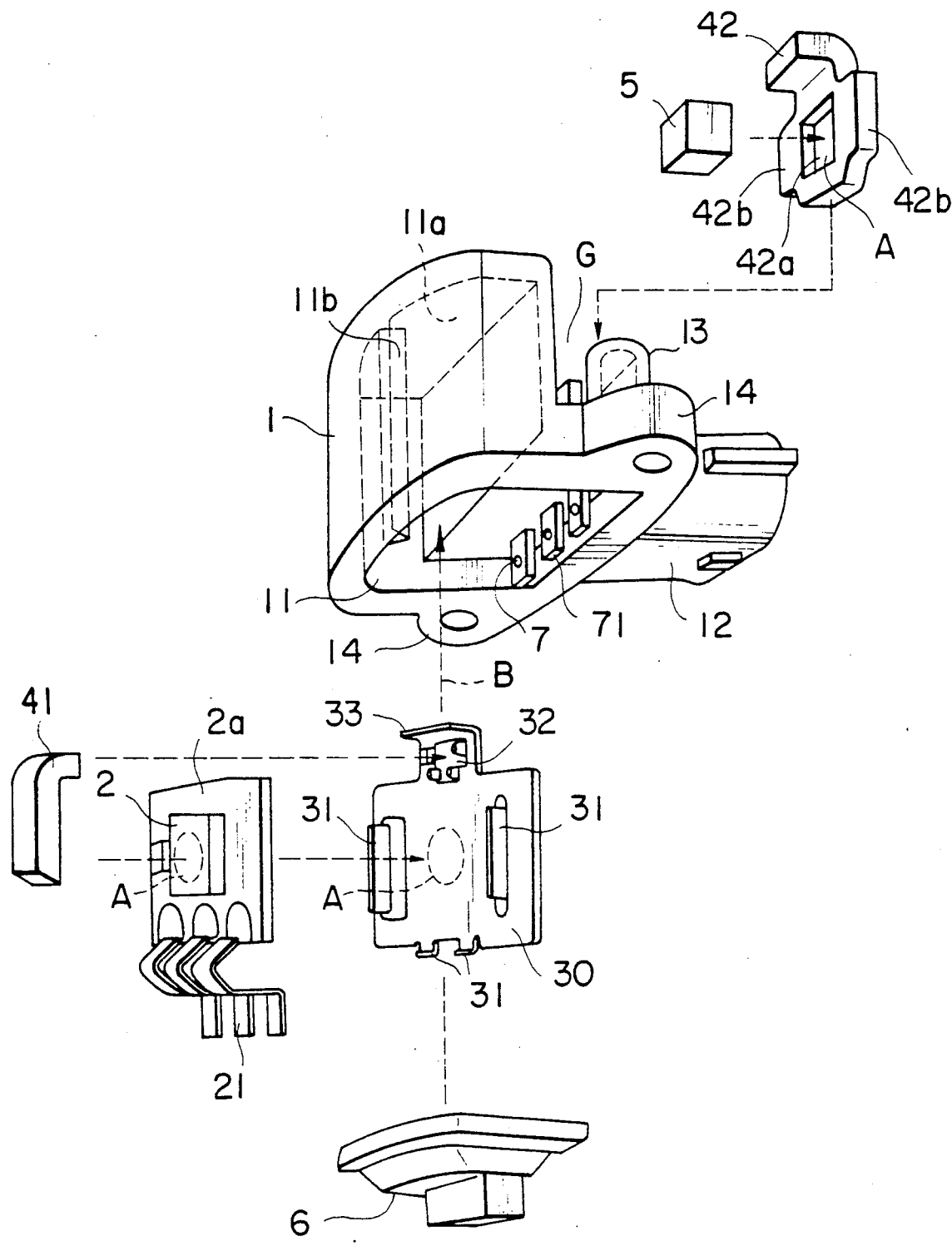
FIG. 3 is an exploded perspective view of a second embodiment of the Hall-effect sensor device according to this invention.
Figure 4:
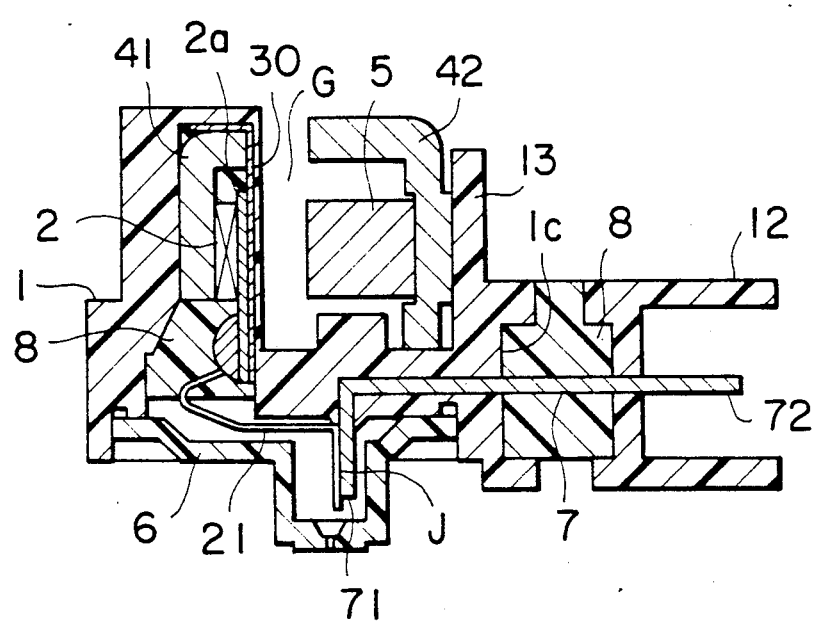
FIG. 4 is a side sectional view of the Hall-effect sensor device of FIG. 3.

Referring next to FIGS. 3 and 4 of the drawings, let us describe a second embodiment of this invention, which can also be suitably used as a crankshaft angle sensor device for controlling the ignition timing of a contactless type ignition system of an automotive internal combustion engine.

The Hall-effect sensor device according to the second embodiment shown in FIGS. 3 and 4 also comprises a frame 1 made of a resin material, which includes: a box-shaped accomodating portion 11 extending upward from the base portion of the frame 1 and opening downward; a connector portion 12 extending towards the right in the figures to form a recess of U-shaped cross section (see FIG. 4); a plate-shaped magnetic flux guide holder 13 having two sides bent into a pair of holding portions having opposed U-shaped horizontal cross sections; and a pair of attachment portions 14 extending laterally from the base portion of the frame 1. The Hall IC 2 mounted on a ceramic substrate 2a is held by a holder plate 30 made of a press-formed stainless steel plate. The holder plate 30 includes: positioning means 31 for holding and positioning the Hall IC 2, which means 31 includes a pair of lateral projections and other claws formed integrally with the plate 30 by cutting and bending the plate 30; engager means 32, including a pair of claws, for holding the first magnetic flux guide 41; and an upper bent portion 33 which abuts on the ceiling 11a of the accommodating portion 11 when the holder plate 30 is inserted and accomodated therein.

The rectangular prism-shaped first magnetic flux guide 41 having an inverted L-shaped vertical cross section is disposed, at its vertically extending portion, between the Hall IC 2 and a triangular projection 11b (see FIG. 3) formed on the interior surface of the back side wall (at the left in the figures) of the accomodating portion 11; the upper bent end portion thereof is held between the claws of the engager means 32, as described above. On the other hand, the plate-shaped second magnetic flux guide 42, which is fitted to and supported by the holder 13 of the frame 1, comprises a rectangular recess 42a to which the permanent magnet 5 is adhered by an adhesive, and a pair of wing 42a engaging with the two U-shaped holding portions of the holder 13. The opposing surfaces of the Hall IC 2 and the permanent magnet 5 and those of the first and second magnetic flux guides 41 and 42 oppose each other across a gap G through which a magnetic shutter (not shown) is translated. Further, the bottom of the frame 1 is closed by a cover 6; and an end of each inserted conductor 7 is exposed within the cover 6 to form downwardly bent connecting portions 71 for the leads 21 of the Hall IC 2; the connecting portions 71 are spot-welded to the leads 21 at the portions J. The other end of each one of the inserted conductors 7 extends into the recess of the connector portion 12 to from connector pins 72. A filler material 8, made, for example of silicon gel, is filled to close the bottom opening of the accommodating portion 11 of the frame 1 and to fill the hole 1c formed in the base portion of the frame 1.

The assembling of the Hall-effect senSor device of FIGS. 3 and 4 is effected as follows. First, by applying an adhesive to the portions shown by circles A in FIG. 3, the holder plate 30, the Hall IC 2, and the first magnetic flux guide 41 are assembled together, to obtain a preliminary assembly (not shown). Further, after applying an amount of adhesive to the ceiling 11a of the accommodating portion 11, the preliminary assembly as obtained above is inserted into the accomodating portion 11 in the direction shown by the dotted arrow B in FIG. 3, until the bent portion 33 abuts on the ceiling 11a. Next, the leads 21 and the connecting portions 71 of the inserted conductors 7 are spot welded at the portions J shown in FIG. 4. On the other hand, by means of an adhesive applied to the portion A in the recess 42a of the second magnetic flux guide 42, the permanent magnet 5 is adhered to the second magnetic flux guide 42, which is then fitted to the magnetic flux guide holder 13. Thereafter the filler material 8 is filled to close the bottom opening of the accomodating portion 11 and to fill the hole 1c in the frame 1 exposing the inserted conductors 7 in the frame 1. Finally, the cover 6 is fitted to the bottom of the frame 1 by means of an adhesive.

The method of operation of the Hall-effect sensor device of FIGS. 3 and 4 is the same as that of the first embodiment described above. Further, the corresponding parts thereof may be made of the same material as those of the first embodiment where they are not specifically mentioned.

The Hall-effect sensor device of FIGS. 3 and 4 is also enhanced in signal accuracy and lends itself to an easy and simple assembling process. Namely, the Hall IC 2 is held to a predetermined position by the positioning means 31 of the holder plate 30, and the holder plate 30 is then inserted into the frame 1. Thus, the relative position of the Hall IC 2 with respect to other parts is precisely determined by the positioning means 31 of the holder plate 30. Hence, sensors with enhanced signal accuracy can be obtained. In addition, since no jigs are necessary for fixing the relative positions of the parts during the assembling step, the assembling thereof can be effected easily.

Incidentally, in the above embodiment, the positioning means 31 is constituted by claws and projections which are formed integrally with the holder plate 30 by cutting and bendinq a single stainless steel plate; however, the positioning means for positioning the Hall IC is not limited to this particular form and material. Further, the positions and arrangements, the forms, or the number of claws, etc., of the positioning means are not limited to those of the above embodiment.

While description has been made of a particular embodiment of this invention, it will be understood that many modifications may be made without departing from the spirit thereof. For example, the Hall sensor device according to this invention can be utilized as a position or a velocity sensor, wherein the magnetic flux shutter is translated linearly. The appended claims are contemplated to cover any such modifications as fall within the true spirit and scope of this invention.

What is claimed is:

1. A Hall-effect sensor device for generating an electrical signal in response to a variation of magnetic flux caused by a magnetic shutter, comprising:

an integrally molded frame of a resin material defining a box-shaped cavity (11) open in one direction, and a magnetic flux guide holder (13) disposed opposite a side wall of the cavity across a predetermined gap;

a Hall-effect sensor element (2,2a) for converting a variation of magnetic flux caused by the magnetic shutter into an electrical signal, said sensor element being disposed within said cavity of the integrally molded frame;

positioning means disposed within said cavity and engaging both a wall thereof and said sensor element for establishing a desired mounting position of the Hall-effect sensor element with respect to said frame;

a first magnetic flux guide (41) made of a magnetic material, disposed in said cavity of the frame in a fixed positional relation with respect to said frame and in engagement with said Hall-effect sensor element;

a second magnetic flux guide (42) held by said magnetic flux guide holder of the frame in a fixed positional relation with respect to said frame; and a magnet (5) adhered to said second magnetic flux guide so as to oppose said Hall-effect sensor element across said predetermined gap through which the magnetic flux shutter is translated to cause the variation of the magnetic flux that passes through the Hall-effect sensor element, said flux guides establishing a magnetic circuit loop and serving to channel magnetic flux in said loop through said sensor element.

2. A Hall-effect sensor device as claimed in claim 1, wherein said positioning means comprises: at least one position determining planar face portion on a interior surface of the box-shaped cavity of said frame, a surface of the Hall-effect sensor element abutting on the position determining planar face portion; and a resilient member (3) which urges the Hall-effect sensor element toward said position determining planar face portion.

3. A Hall-effect sensor device as claimed in claim 2, wherein said resilient member urges the Hall-effect sensor element via the first magnetic flux guide disposed between the resilient member and the Hall-effect sensor element.

4. A Hall-effect sensor device as claimed in claim 2, wherein:

said positioning means comprises two position determining planar face portions formed on interior surfaces of the cavity of the frame to form a right angle therebetween, the Hall-effect sensor element abutting on the two position determining planar face portions at surfaces of a plate-shaped substrate (2a) thereof;

and said resilient member urges the Hall-effect sensor element in two directions toward the two position determining planar face portions.

5. A Hall-effect sensor device as claimed in claim 1, wherein said positioning means comprises a holder plate (30) having positioning means for holding and positioning the Hall-effect sensor element, said holder plate being disposed within the cavity of the frame in a fixed positional relation with respect thereto.

6. A Hall-effect sensor device as claimed in claim 5, wherein the opening of said cavity of the frame is closed by a filler material filled therein.

7. A Hall-effect sensor device as claimed in claim 6, wherein said holder plate is made of a press-formed stainless steel plate having a plurality of projections consituting the positioning means of the holder plate.

8. A Hall-effect sensor device as claimed in claim 7, wherein said holder plate comprises a bent end portion which abuts an interior surface of the cavity opposing the opening thereof.

9. A Hall-effect sensor device as claimed in claim 8, wherein said holder plate further comprises engager means for engaging with an end portion of the first magnetic flux guide.

10. A Hall-effect sensor device as claimed in claims 2 or 5, further comprising an inserted conductor electrically coupled to a lead of said Hall-effect sensor element and extending through an interior of the frame, wherein the frame further comprises a connector portion having a recess into which the inserted conductor extends to form a connector pin.

11. A Hall-effect sensor device as claimed in claim 1, wherein said Hall-effect sensor element comprises a Hall IC.

12. A Hall-effect sensor device as claimed in claim 10, further comprising a cover which covers and closes a hollow portion of the frame into which the inserted conductor is exposed to be coupled to the lead of the Hall-effect sensor element therein.

* * * * *